US007796425B2

(12) United States Patent
Choi et al.

(10) Patent No.: US 7,796,425 B2
(45) **Date of Patent: *Sep. 14, 2010**

(54) CONTROL OF SET/RESET PULSE IN RESPONSE TO PERIPHERAL TEMPERATURE IN PRAM DEVICE

(75) Inventors: Byung-Gil Choi, Yongin-si (KR); Choong-Keun Kwak, Suwon-si (KR); Woo-Yeong Cho, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 153 days.

This patent is subject to a terminal disclaimer.

(21) Appl. No.: 11/985,975

(22) Filed: Nov. 19, 2007

(65) Prior Publication Data

US 2008/0212362 A1 Sep. 4, 2008

Related U.S. Application Data

(63) Continuation of application No. 11/124,341, filed on May 6, 2005, now Pat. No. 7,315,469.

(30) Foreign Application Priority Data

May 8, 2004 (KR) .............................. 2004-32501

(51) Int. Cl.

| | |
|---|---|
| ***G11C 11/00*** | (2006.01) |
| ***G11C 7/04*** | (2006.01) |
| ***G11C 11/4193*** | (2006.01) |
| ***G11C 11/4197*** | (2006.01) |

(52) U.S. Cl. ...................... 365/163; 365/194; 365/202; 365/211

(58) Field of Classification Search ................ 365/163, 365/194, 202, 211, 222

See application file for complete search history.

(56) References Cited

U.S. PATENT DOCUMENTS

| | | | | |
|---|---|---|---|---|
| 3,564,206 A * | 2/1971 | Lauck, III | .................. | 219/501 |
| 5,949,268 A * | 9/1999 | Miura et al. | ................ | 327/278 |
| 6,204,714 B1 * | 3/2001 | Milshtein et al. | ............ | 327/299 |
| 6,735,546 B2 * | 5/2004 | Scheuerlein | ................ | 702/132 |
| 6,885,602 B2 * | 4/2005 | Cho et al. | .................. | 365/211 |
| 7,113,424 B2 * | 9/2006 | Happ et al. | ................ | 365/163 |
| 7,315,469 B2 * | 1/2008 | Choi et al. | .................. | 365/163 |
| 2003/0002332 A1 * | 1/2003 | Lowrey | ...................... | 365/163 |
| 2003/0046020 A1 * | 3/2003 | Scheuerlein | ................ | 702/132 |
| 2004/0057325 A1 * | 3/2004 | Menczigar | .................. | 365/232 |
| 2004/0151023 A1 * | 8/2004 | Khouri et al. | ............... | 365/163 |

* cited by examiner

*Primary Examiner*—Jung Hur
(74) *Attorney, Agent, or Firm*—Monica H. Choi

(57) ABSTRACT

A driver circuit for a PRAM (phase-change random access memory) device includes a write driver that generates a set/reset current in response to a set/reset pulse. In addition, a temperature compensator controls a pulse width of the set/reset pulse in response to a peripheral temperature of the PRAM device. For example, the temperature compensator maintains the pulse width to be substantially constant irrespective of the peripheral temperature. In another example, the temperature compensator decreases the pulse width for higher peripheral temperature.

19 Claims, 7 Drawing Sheets

CONTROL OF SET/RESET PULSE IN RESPONSE TO PERIPHERAL TEMPERATURE IN PRAM DEVICE

The present application is a continuation of an earlier filed copending patent application with Ser. No. 11/124,341 filed on May 6, 2005, now U.S. Pat. No. 7,315,469 for which priority is claimed. This earlier filed copending patent application with Ser. No. 11/124,341 is in its entirety incorporated herewith by reference.

The present application also claims priority to Korean Patent Application No. 2004-32501, filed on May 8, 2004, in the Korean Intellectual Property Office, the disclosure of which is incorporated herein in its entirety by reference. A certified copy of Korean Patent Application No. 2004-32501 is contained in the parent copending patent application with Ser. No. 11/124,341.

BACKGROUND OF THE INVENTION

1. Field of the Invention

The present invention relates generally to PRAM (phase-change random access memory) devices, and more particularly, to controlling the width of a set/reset pulse in a PRAM device in response to a peripheral temperature of the PRAM device.

2. Description of the Related Art

A PRAM (phase-change random access memory) device is a non-volatile memory which stores data using materials such as Ge—Sb—Te alloys with resistance that changes with temperature. Such a phase change material, used in a cell of the PRAM, melts or crystallizes when heated depending on temperature and heating time to store information. Changing the phase of the phase change material requires a high temperature, above 900° C., typically obtained by Joule heating from current flowing through the phase change material.

Data is written by flowing current through the phase change material for Joule heating. When the phase change material is heated above its melting temperature to thereafter be quickly cooled, the phase change material becomes amorphous (i.e., in a 'reset' state) to store a data bit of '1'. Alternatively, when the phase change material is heated above its crystallization temperature and maintained at that temperature for a predetermined time before cooling, the phase change material becomes crystalline (i.e., in a 'set' state) to store a data bit of '0'.

Data is read from a PRAM cell by selecting a bit line and a word line for that PRAM cell, flowing a current through that PRAM cell, and distinguishing '1' from '0' from the voltage generated from the variable resistance of the phase change material of that PRAM cell.

The write operation for a PRAM cell depends greatly on the change of peripheral temperature. Peripheral temperature is a temperature of the semiconductor substrate having the PRAM cell fabricated therein. Such peripheral temperature determines a write current and a dynamic resistance of the phase change material of the PRAM cell.

Generally, with increased peripheral temperature, the drive performance of transistor(s) generating the write current deteriorates resulting in decreased write current and in decreased dynamic resistance of the phase change material. Accordingly, the heat energy (i.e., temperature) from Joule heating is greatly reduced such that the phase change material may be incompletely crystallized or melted. As a result, the difference in resistance between a reset state and a set state is diminished, possibly causing read errors.

FIG. 1 shows a graph of reset resistance (R_RESET) and set resistance (R_SET) versus peripheral temperature. Referring to FIG. 1, the ratio of R_RESET to R_SET decreases significantly with increased peripheral temperature because the phase change material may not reach the crystallization or melting temperatures at the higher peripheral temperature. As a result, the sensing margin for distinguishing a set state from a reset state during a data read operation is reduced at the higher peripheral temperature.

FIG. 2A shows a graph of reset write current (I_RESET) and set write current (I_SET), versus peripheral temperature. FIG. 2B shows a graph of reset heat energy (E_RESET) and set heat energy (E_SET), versus peripheral temperature. Referring to FIG. 2A, with higher peripheral temperature, the performance of drive transistor(s) deteriorates for reduced write current (I_RESET and I_SET).

Referring to FIG. 2B, heat energy (E_RESET and E_SET) is generated from Joule heating which is proportional to the square of the current flowing through the PRAM cell and to the resistance of the phase change material. With increased peripheral temperature, the current flowing through the PRAM cell and the resistance of the phase change material are reduced such that the heat energy is quickly reduced. As a result, the phase change material is incompletely crystallized or melted, with decreased difference between the reset resistance and the set resistance causing sensing error during a read operation.

Also with increased peripheral temperature, the performance of drive transistor(s) deteriorates, and the pulse widths of a set pulse and a reset pulse become longer. The pulse width of a set/reset pulse determines a set/reset current for setting the phase change material in a set/reset state. The longer pulse width of a set pulse increases the resistance of the phase change material in the set state, further reducing the difference between the reset and set resistances and increasing current consumption of the PRAM device.

SUMMARY OF THE INVENTION

Accordingly, a circuit and method of the present invention controls the pulse width of the set/reset pulse despite changes in peripheral temperature of the PRAM device.

A driver circuit for a PRAM (phase-change random access memory) device includes a write driver that generates a set/reset current in response to a set/reset pulse. In addition, a temperature compensator controls a pulse width of the set/reset pulse in response to a peripheral temperature of the PRAM device.

In another embodiment of the present invention, the driver circuit also includes a temperature detector that generates a control signal indicating the peripheral temperature of the PRAM device.

In a further embodiment of the present invention, a voltage level of the control signal increases with increase of the peripheral temperature.

In one embodiment of the present invention, the temperature compensator maintains the pulse width to be substantially constant irrespective of the peripheral temperature. In that case, the temperature compensator includes at least one forward controller that each advances an end of the set/reset pulse for a higher level of the peripheral temperature, and at least one delay controller that each delays an end of the set/reset pulse for a higher level of the peripheral temperature.

In another embodiment of the present invention, the temperature compensator decreases the pulse width for a higher level of the peripheral temperature. In that case, the temperature compensator includes at least one forward controller that each advances an end of the set/reset pulse for a higher level of the peripheral temperature.

In this manner, the pulse width of the set/reset pulse is controlled in response to the peripheral temperature of the PRAM device. Thus, the set/reset current determined from the set/reset pulse is controlled in response to the peripheral temperature. With controlled set/reset current, heat energy from Joule heating in the phase change material is controlled resulting in desired set/reset resistance of the phase change material.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2A, 2B, 3, 4A, 4B, 5, 6, 7, and 8 refer to elements having similar structure and/or function.

DETAILED DESCRIPTION OF THE INVENTION

Figure 1:
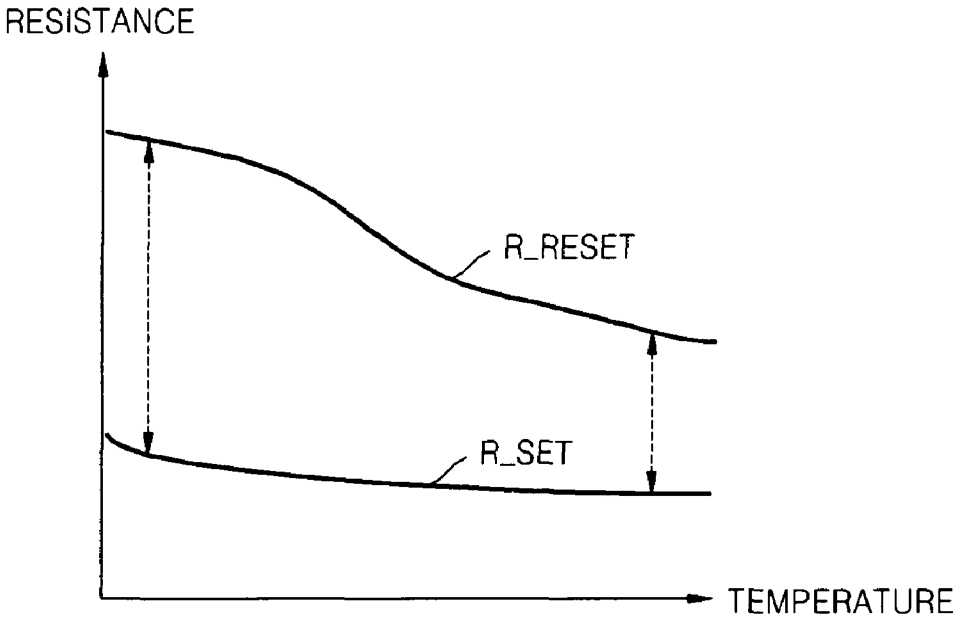
FIG. 1 shows a graph of reset resistance (R_RESET) and set resistance (R_SET) versus peripheral temperature.
Figure 2A:
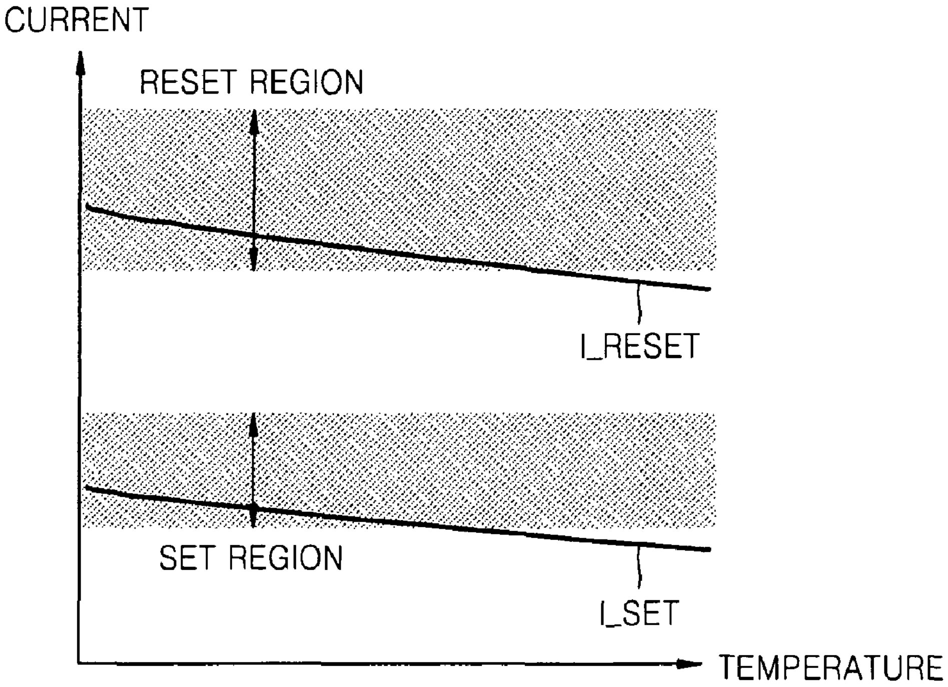
FIG. 2A shows a graph of reset write current (I_RESET) and set write current (I_SET) versus peripheral temperature.
Figure 2B:
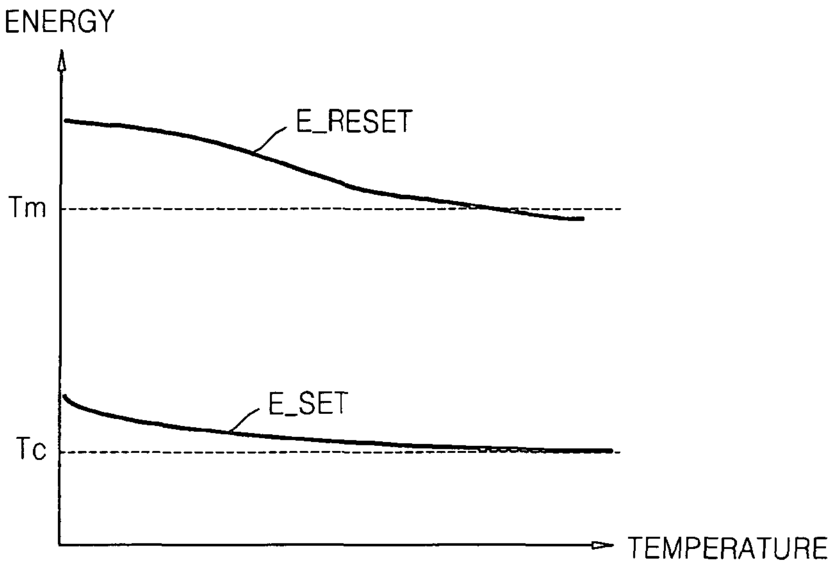
FIG. 2B shows a graph of reset heat energy (E_RESET) and set heat energy (E_SET) versus peripheral temperature.
Figure 3:
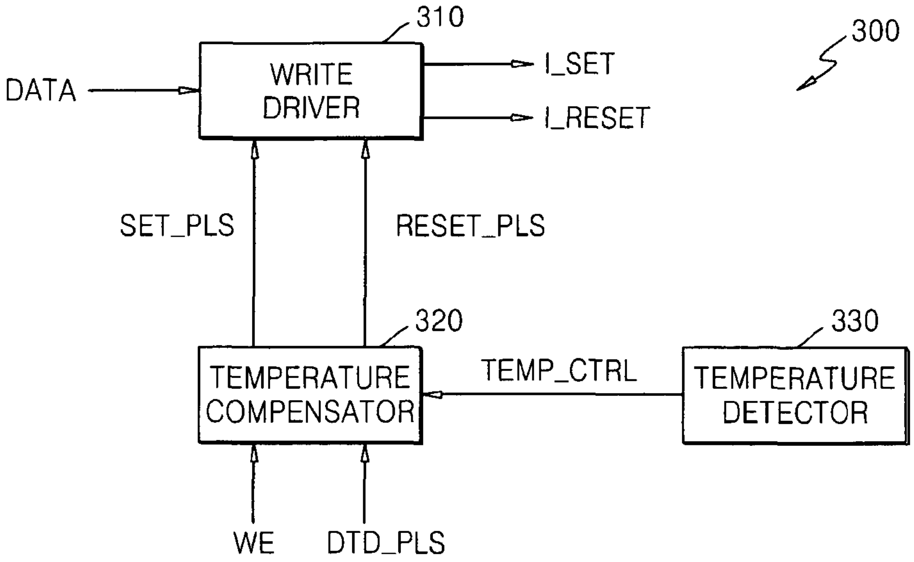
FIG. 3 is a block diagram of a driver circuit with control of pulse width of a set/reset pulse with change in peripheral temperature, according to an embodiment of the present invention.

FIG. 3 shows a block diagram of a driver circuit 300 according to an embodiment of the present invention. Referring to FIG. 3, the driver circuit 300 includes a write driver 310 and a temperature compensator 320. The write driver 310 receives data DATA and generates a set current I_SET or a reset current I_RESET for controlling a state of phase change material of a PRAM (phase-change random access memory) cell in response to a set pulse SET_PLS or a reset pulse RESET_PLS.

The temperature compensator 320 controls the pulse width of the set/reset pulse, SET_PLS or RESET_PLS, in response to a write activation signal WE, a data pulse DTD_PLS, and the peripheral temperature as indicated by a control signal TEMP_CTRL. In one embodiment of the present invention, the temperature compensator 320 maintains a constant pulse width of the set/reset pulse, SET_PLS or RESET_PLS, irrespective of the peripheral temperature. In contrast in a conventional PRAM device, as the peripheral temperature increases, the performance of drive transistor(s) deteriorates such that the pulse width of the set/reset pulse undesirably increases.

The driver circuit 300 also includes a temperature detector 330 for generating the control signal TEMP_CTRL in one embodiment of the present invention. The temperature detector 330 detects the peripheral temperature to generate the control signal TEMP_CTRL with a voltage level indicating the peripheral temperature. For example, the voltage level of the control signal TEMP_CTRL increases with an increase of the peripheral temperature.

Figure 4A:
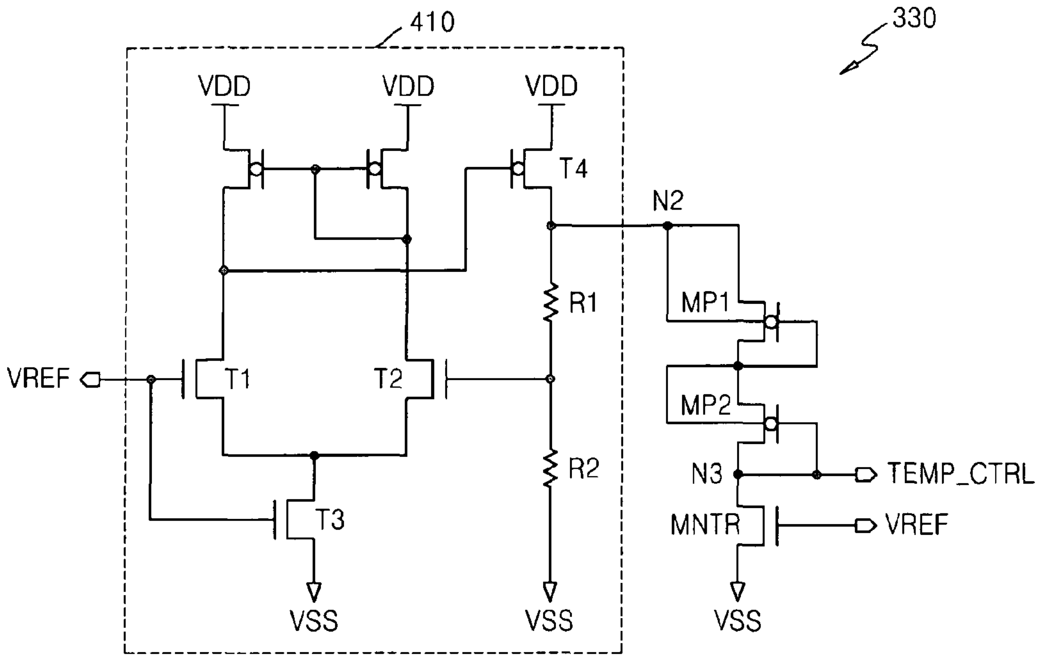
FIG. 4A is a circuit diagram of a temperature detector of FIG. 3, according to an embodiment of the present invention.
Figure 4B:
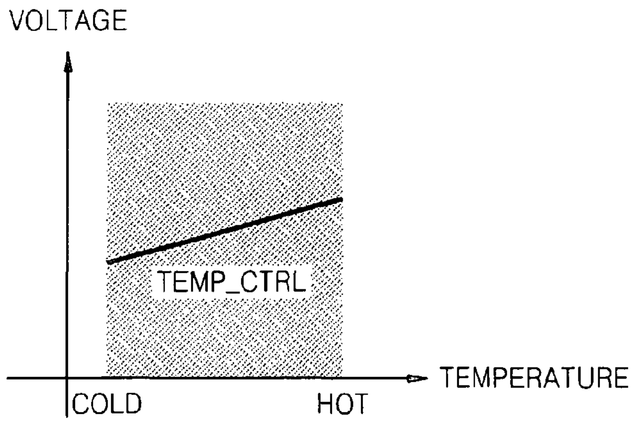
FIG. 4B shows a graph of a voltage level of a control signal generated by the temperature detector of FIG. 4A versus peripheral temperature, according to an embodiment of the present invention.

FIG. 4A shows a circuit diagram of the temperature detector 330 of FIG. 3, according to an example embodiment of the present invention. FIG. 4B shows a graph of a voltage level of the control signal TEMP_CTRL generated by the temperature detector of FIG. 4A versus peripheral temperature.

Referring to FIG. 4A, the temperature detector 330 includes a bias unit 410, first and second diode-type transistors MP1 and MP2, and a third transistor MNTR. The bias unit 410 receives a reference voltage VREF and controls the voltage of a second node N2 according to the ratio of a first resistance R1 to a second resistance R2. In more detail, the bias unit 410 compares the reference voltage VREF with a voltage obtained by dividing a high supply voltage VDD by the ratio of the first resistance R1 to the second resistance R2 (assuming that a low supply voltage VSS is for a ground node), and maintains the voltage at the second node N2 constant.

If the reference voltage VREF is greater than VDD divided by such a resistance ratio, a current flowing through a left transistor T1 becomes more than a current flowing through a right transistor T2. As a result, a current flowing through a top transistor T4 (and through the first and second resistors R1 and R2) increases such that the voltage of the second node N2 increases.

Alternatively, if the reference voltage VREF is less than VDD divided by such a resistance ratio, a current flowing through the right transistor T2 becomes more than a current flowing through the left transistor T1. As a result, the current flowing through the top transistor T4 (and through the first and second resistors R1 and R2) decreases such that the voltage of the second node N2 decreases.

In this manner, the voltage at the second node N2 is maintained to be constant.

Further referring to FIG. 4A, the first and second diode-type transistors MP1 and MP2 are coupled in series between the second node N2 and a third node N3. A source of the first diode-type transistor MP1 is coupled to the second node N2, a drain and a gate of the first diode-type transistor MP1 are coupled to each other, and a bulk of the first diode-type transistor MP1 is coupled to the second node N2.

A source of the second diode-type transistor MP2 is coupled to the drain of the first diode-type transistor MP1, a gate and a drain of the second diode-type transistor MP2 are coupled together at the third node N3, and a bulk of the second diode-type transistor MP2 is coupled to the drain of the first diode-type transistor MP1.

A third transistor MNTR is coupled between the third node N3 and a ground voltage VSS. In addition, a reference voltage VREF is applied to a gate of the third transistor MNTR that outputs the control signal, TEMP_CNTRL from the third node N3.

The first and second diode-type transistors MP1 and MP2 each have relatively small resistance, and the third transistor MNTR has a relatively large resistance. The threshold voltage of a transistor decreases with increase of the peripheral temperature.

As a result, the first and second diode-type transistors MP1 and MP2 flow more current to the third node N3 as the peripheral temperature increases. Thus, the voltage of the control signal TEMP_CTRL at the third node N3 increases with increase of the peripheral temperature, as illustrated in FIG. 4B.

Figure 5:
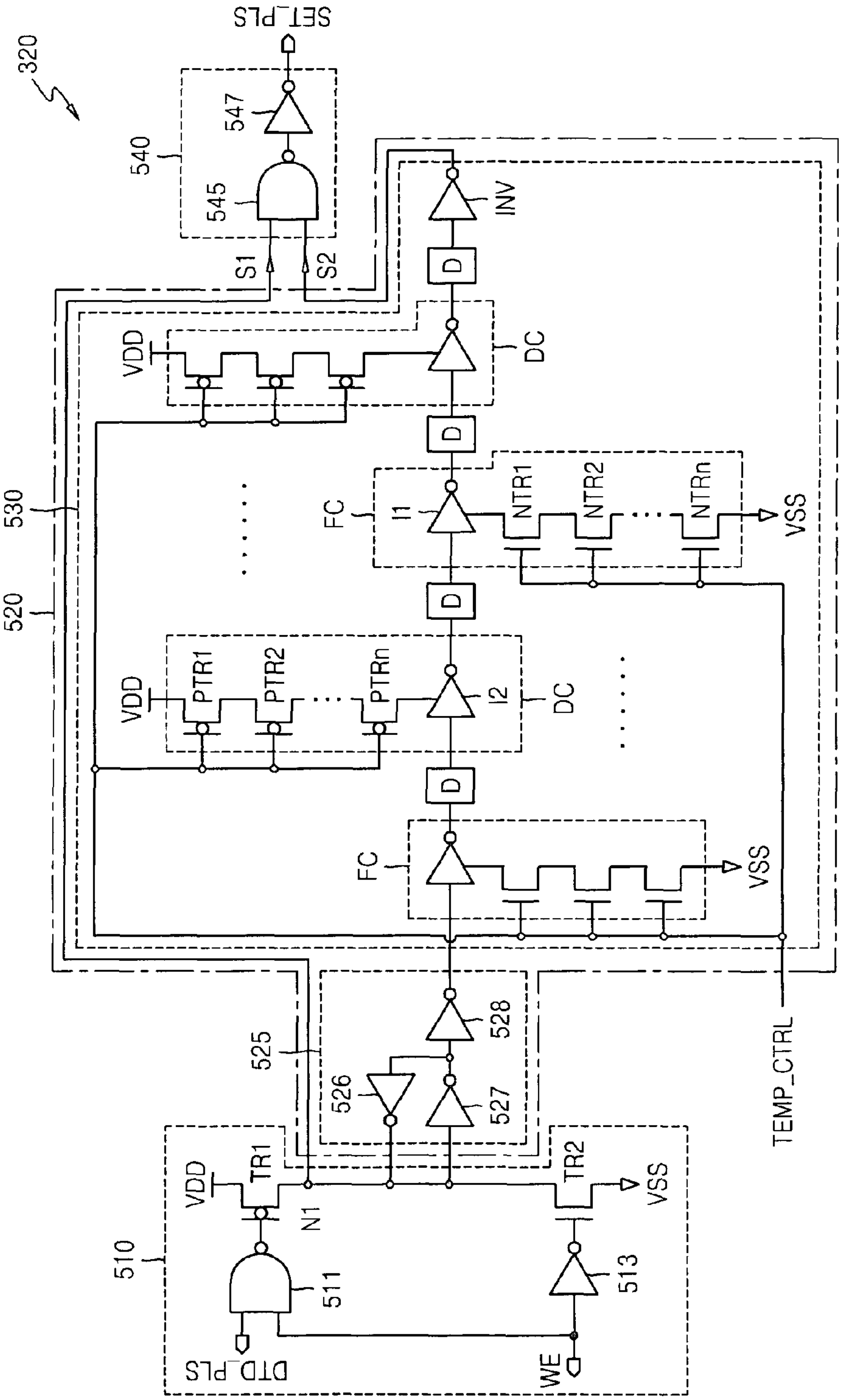
FIG. 5 is a circuit diagram of a temperature compensator of FIG. 3 that maintains a pulse width of a set/reset pulse irrespective of peripheral temperature, according to an embodiment of the present invention.
Figure 6:
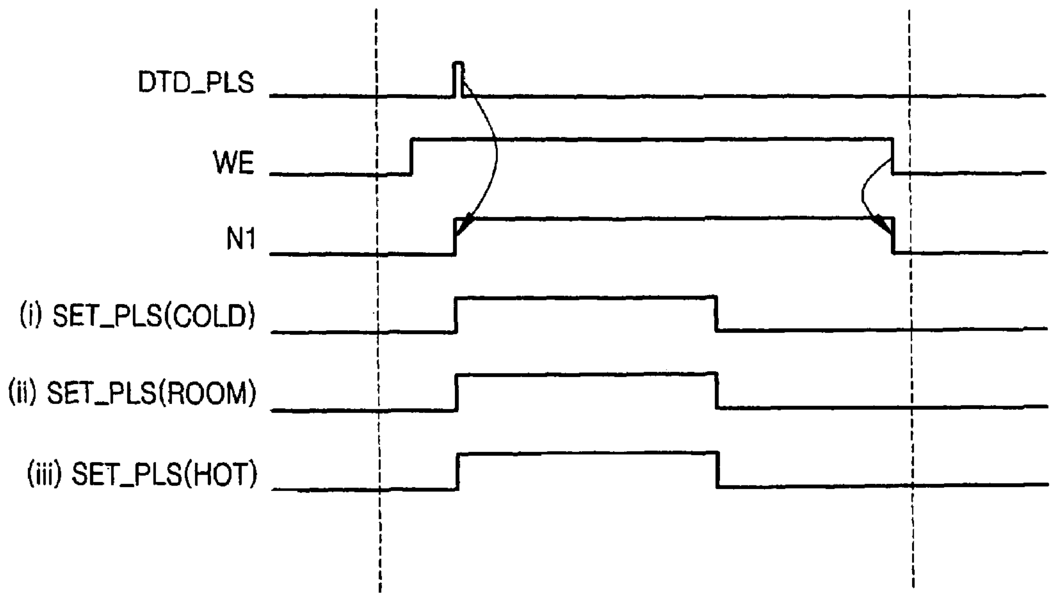
FIG. 6 shows a timing diagram of signals during operation of the temperature compensator of FIG. 5, according to an embodiment of the present invention.

FIG. 5 is a circuit diagram of the temperature compensator 320 of FIG. 3 that maintains a pulse width of a set/reset pulse irrespective of peripheral temperature. FIG. 6 shows a timing diagram of signals during operation of the temperature compensator 320 of FIG. 5.

Referring to FIG. 5, the temperature compensator 320 includes a receiver 510, a pulse controller 520, and a pulse generator 540. The receiver 510 controls the logic level of a first signal S1 generated at a first node N1 in response to a data pulse DTD_PLS and a write activation signal WE. The receiver 510 changes the logic level of the first node N1 to a first level when the data pulse DTD_PLS changes to the first level while the write activation signal WE is at the first level.

On the contrary, the receiver 510 changes the logic level of the first node N1 to a second level when the write activation signal WE changes to the second level. Here, for convenience of description, it is assumed that the first level is a logical high level and the second level is a logical low level. However, the present invention may be practiced with different logical levels for the first and second levels.

The receiver 510 includes a NAND device 511 for performing a NAND operation on the data pulse DTD_PLS and the write activation signal WE, a transistor TR1 which is turned on or off in response to the output signal of the NAND device 511, an inverter 513 which inverts the write activation signal WE, and a transistor TR2 with a gate coupled to the output of the inverter 513.

The pulse controller 520 generates a second signal S2 whose logic level changes according to the logic level of the first node N1. Generally, the logic level of the second signal S2 is inverted from the logical level of the first signal S1 with a delay that is controlled by the pulse controller 520 in response to the control signal TEMP_CTRL.

The pulse generator 540 generates a set pulse SET_PLS or a reset pulse RESET_PLS in response to the first signal S1 and the second signal S2. The pulse generator 540 includes an AND device which performs an AND operation on the first signal S1 and the second signal S2, and outputs the resultant signal as a set pulse SET_PLS or a reset_pulse RESET_PLS. In FIG. 5, the AND device is implemented by a NAND device 545 and an inverter 547.

The pulse controller 520 includes a latch unit 525 and a delay time controller 530. The latch unit 525 stores and outputs the logic level of the first signal S1 at the first node N1. The delay time controller 530 inverts the output of the latch unit 525 and outputs the result as the second signal S2. The delay time controller 530 maintains the delay when the logic level of the second signal S2 is inverted from the logical level of the first signal S1 irrespective of the peripheral temperature as indicated by the control signal TEMP_CTRL.

The delay time controller 530 includes a plurality of forward controllers FC and a plurality of delay controllers DC. Each forward controller FC advances the time when the logic level of the second signal S2 is inverted from the logical level of the first signal S1. Each delay controller DC delays the time when the logic level of the second signal S2 is inverted from the logical level of the first signal S1. The forward controllers FC and the delay controllers DC are coupled alternately in series from the latch unit 525. The delay time controller 530 includes an inverter INV for inverting the output signal of the last forward or delay controller FC or DC and outputs the result as the second signal S2.

Each forward controller FC includes a first inverter I1 for inverting and outputting a signal received from a prior forward or delay controller FC or DC. In addition, each forward controller FC includes NMOS transistors NTR1 through NTRn connected in series between a supply node to the first inverter I1 and the ground voltage VSS. The control signal TEMP_CTRL is applied to the gates of the NMOS transistors NTR1 through NTRn.

Each delay controller DC includes a second inverter I2 for inverting and outputting a signal received from a prior forward or delay controller FC or DC. In addition, each delay controller DC includes PMOS transistors PTR1 through PTRn connected in series between the supply voltage VDD and a supply node of the second inverter I2. The control signal TEMP_CTRL is applied to the gates of the PMOS transistors PTR1 through PTRn.

Referring to FIGS. 5 and 6, the operation of the temperature compensator 320 of FIG. 5 is described. The pulse width of either the set pulse SET_PLS or the reset pulse RESET_PLS may be controlled with the present invention. For convenience of description, controlling the pulse width of just the set pulse SET_PLS is described herein. However, the present invention may also be used to control the pulse width of the reset pulse RESET_PLS as would be apparent to one of ordinary skill in the art from the description herein.

Referring to FIGS. 5 and 6, before data DATA is written in the PRAM device, both the write activation signal WE and the data pulse signal DTD_PLS are in an inactive state (i.e., logical low state). Thus, the transistor TR1 is turned off and the transistor TR2 is turned on such that the first node N1 is in an inactive state (i.e., logical low state).

If the first node N1 is at the logical low state, the first signal S1 is at the logical low state, and the output of the latch unit 525 is also at the logical low state. The latch unit 525 includes inverters 526, 527 and 528. The latch unit 525 latches the logical state at the first node N1 during a predetermined time and then outputs such a latched signal.

Since the data DATA is not yet written, the forward and delay controllers FC and DC of the delay time controller 530 do not yet operate and the second signal S2 is at a logical high state. Thus, the set pulse SET_PLS is at the logical low state when the WE signal and the DTD_PLS signal are at the logical low state.

When the data DATA is written in the PRAM device, the write activation (WE) signal and the data pulse (DTD_PLS) signal are activated to the logical high state. Such operation is well known in the art and therefore will not be described in detail. As a result, the transistor TR1 is turned on and the transistor TR2 is turned off so that the first node N1 is changed to the logical high state. Accordingly, the first signal S1 is changed to the logical high state. Thereafter, the logic state of the second signal S2 is inverted from the logical level of the first signal S1 after a total delay time through the latch unit 525 and the delay time controller 530.

Initially after activation of the WE signal and the DTD_PLS signal, both the first and second signals S1 and S2 are at the logical high state such that the set pulse SET_PLS is activated to the logical high state. Thereafter, the second signal S2 become deactivated to the logical low state when the set pulse SET_PLS becomes deactivated to the logical low state at the end of the pulse width of the set pulse SET_PLS.

The temperature compensator 320 of FIG. 5 constantly maintains the time when the set pulse SET_PLS is deactivated (i.e., the end of the pulse width), irrespective of the peripheral temperature. The delay time controller 530 controls the time when the second signal S2 becomes deactivated to the logical low state using the forward and delay controllers FC and DC.

Each forward controller FC includes NMOS transistors NTR1 through NTRn which conduct a higher level of current with increased voltage of the control signal TEMP_CTRL (i.e., at higher peripheral temperature). When a higher level of current is applied to a supply node of the first inverter I1, the delay through that inverter I1 in the forward controller FC decreases.

Each delay controller DC includes PMOS transistors PTR1 through PTRn which conduct a lower level of current with increased voltage of the control signal TEMP_CTRL (i.e., at higher peripheral temperature). When a lower level of current is applied to a supply node of the second inverter I2, the delay through that inverter I2 in the delay controller DC increases.

In this manner, for increased peripheral temperature, the delay through each forward controller FC is decreased, but the delay through each delay controller DC is increased. The sum result is that the total delay through all of the forward and delay controllers FC and DC is maintained to be substantially constant with any change in peripheral temperature.

Thus, the logic state of the second signal S2 is inverted from the logical level of the first signal S1 after a total delay time through the delay time controller 530 that remains substantially constant irrespective of peripheral temperature. Thus, as illustrated in FIG. 6, the pulse width of the set pulse SET_PLS is substantially the same for the cold, room, and hot peripheral temperatures.

The pulse width of the set pulse SET_PLS may be determined by adjusting the number and size of the PMOS transistors PTR1 through PTRn in the delay controllers DC and of the NMOS transistors NTR1 through NTRn in the forward controller FC.

With such constant pulse width, the set resistance of the phase change material is not increased with reduced sensing margin at increased peripheral temperature. Also, average current consumption is reduced with such pulse width that is maintained to be constant instead of increasing with increased peripheral temperature. The delay time controller 530 may also include additional delay units D that provide additional delay after the latch unit 525.

Figure 7:
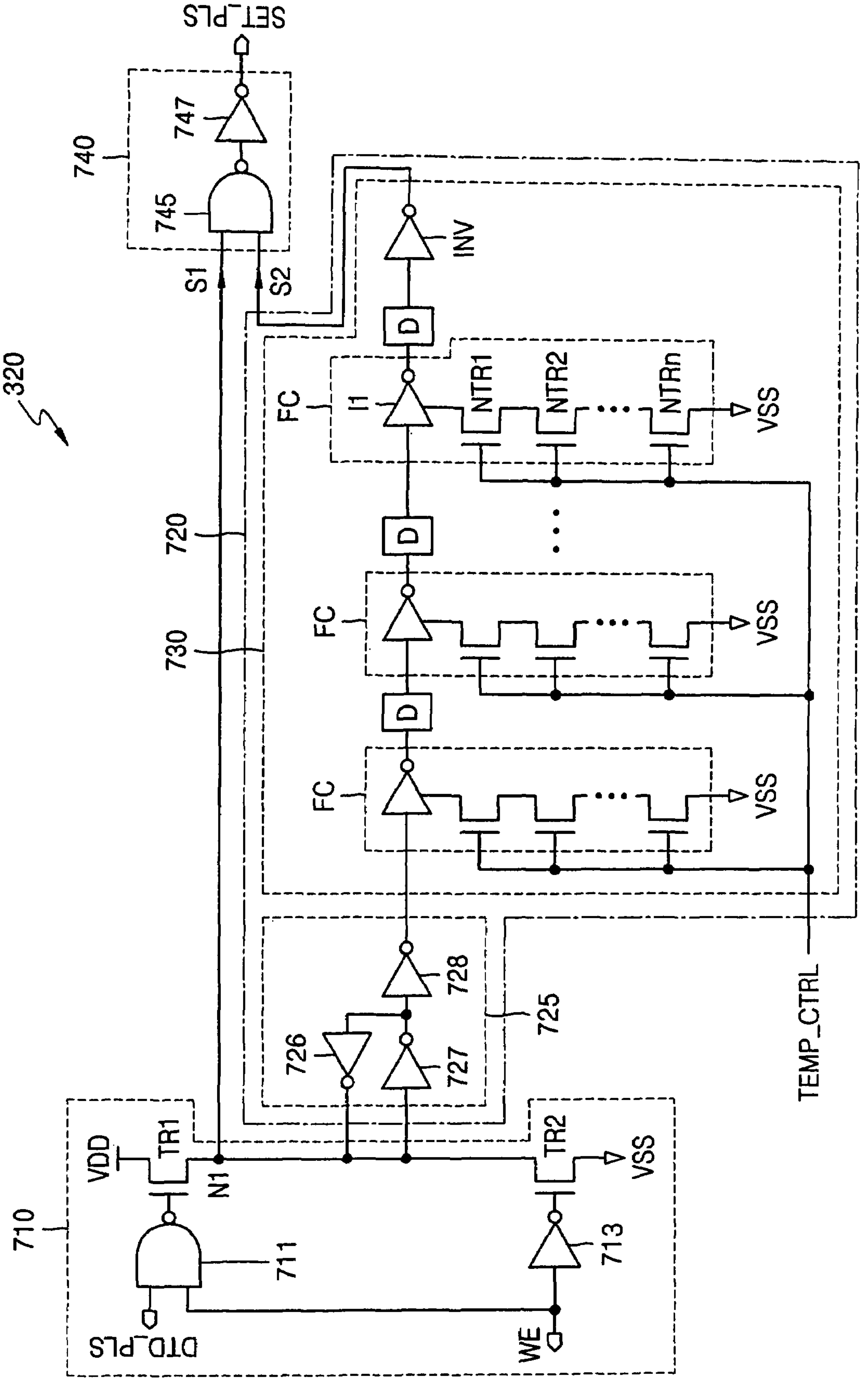
FIG. 7 is a circuit diagram of a temperature compensator of FIG. 3 that decreases a pulse width of a set/reset pulse with increased peripheral temperature, according to an embodiment of the present invention.
Figure 8:
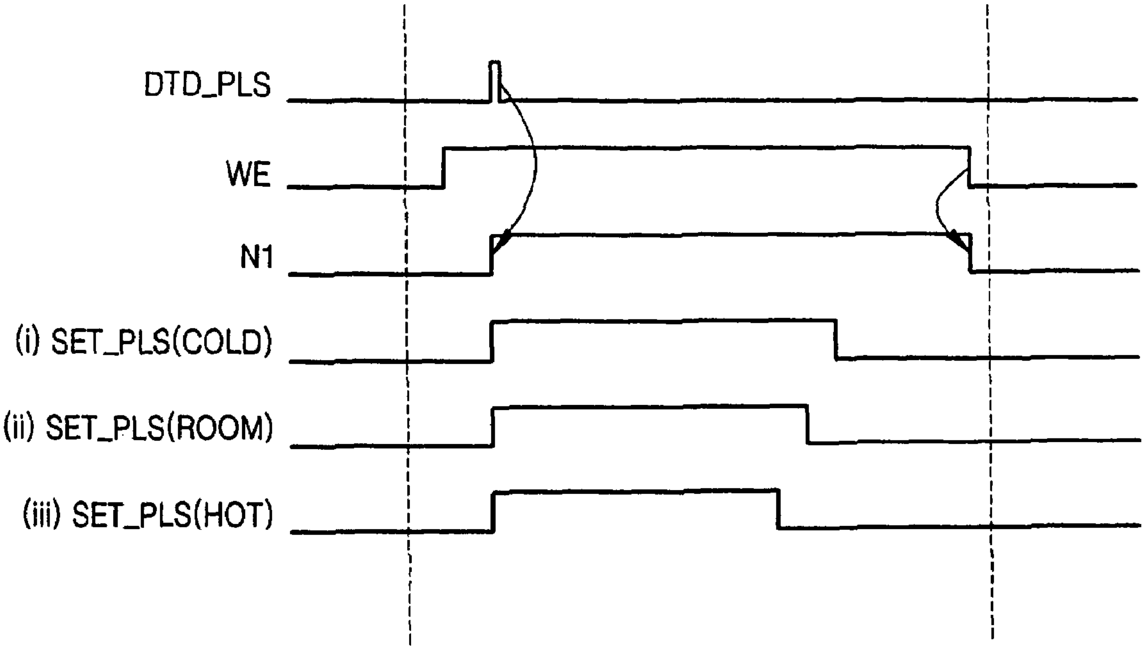
FIG. 8 shows a timing diagram of signals during operation of the temperature compensator of FIG. 7, according to an embodiment of the present invention.

FIG. 7 shows a circuit diagram of a temperature compensator 320 of FIG. 3 that decreases a pulse width of the set pulse SET_PLS (or the reset pulse RESET_PLS) with increased peripheral temperature. FIG. 8 shows a timing diagram of signals during operation of the temperature compensator 320 of FIG. 7.

Referring to FIGS. 7 and 8, the operation of the temperature compensator 320 of FIG. 7 is described. The temperature compensator 320 of FIG. 7 includes a receiver 710, a pulse controller 720 and a pulse generator 730.

The receiver 710 controls the logic level of a first signal S1 generated at a first node N1 in response to a data pulse DTD_PLS and a write activation signal WE. The receiver 710 of FIG. 7 has similar structure/function as the receiver 510 of FIG. 5 and therefore a detailed description thereof is omitted.

The pulse controller 720 generates a second signal S2 whose logic level changes according to the logic level of the first node N1. Generally, the logic level of the second signal S2 is inverted from the logical level of the first signal S1 with a delay that is controlled by the pulse controller 720 in response to the control signal TEMP_CTRL.

The pulse generator 740 generates a set pulse SET_PLS or a reset pulse RESET_PLS in response to the first signal S1 and the second signal S2. The pulse generator 740 has similar structure/function as the pulse generator 540 of FIG. 5 and therefore a detailed description thereof is omitted.

The pulse controller 720 includes a latch unit 725 which stores and outputs the logic level at the first node N1. In addition, the pulse controller 720 includes a delay time controller 730 that inverts the output of the latch unit 525 and outputs the result as the second signal S2. The delay time controller 730 decreases the delay when the logic level of the second signal S2 is inverted from the logical level of the first signal S1 with increased peripheral temperature as indicated by the control signal TEMP_CTRL.

The delay time controller 730 includes a plurality of forward controllers FC. Each forward controller FC advances the time when the logic level of the second signal S2 is inverted from the logical level of the first signal S1 with increased peripheral temperature. The forward controllers FC are connected in series after the latch unit 725. The last of the forward controllers FC is connected to an inverter INV that outputs the second signal S2.

Each forward controller FC includes a first inverter I1 for inverting and outputting a signal received from a prior forward controller FC. In addition, each forward controller FC includes NMOS transistors NTR1 through NTRn connected in series between a supply node to the first inverter I1 and the ground voltage VSS. The control signal TEMP_CTRL is applied to the gates of the NMOS transistors NTR1 through NTRn.

The delay time controller 730 of FIG. 7 includes only forward controllers FC without any delay controllers DC, in contrast to the delay time controller 530 of FIG. 5. The NMOS transistors NTR1 through NTRn of each forward controller FC conduct a higher level of current with increased voltage of the control signal TEMP_CTRL (i.e., at higher peripheral temperature). When a higher level of current is applied to a supply node of the first inverter I1, the delay through that inverter I1 in the forward controller FC decreases.

Accordingly, as the peripheral temperature increases, the time when the logic level of the second signal S2 is inverted from the logical level of the first signal S1 advances. Thus, the pulse width of the set pulse SET_PLS decreases with increased peripheral temperature. Referring to FIG. 8, the pulse width of the set pulse SET_PLS decreases as the peripheral temperature increases from cold to room to hot temperatures.

With such decreasing pulse width, the set resistance of the phase change material is not increased with reduced sensing margin at increased peripheral temperature. Also, average current consumption is reduced with such decreasing pulse width with increased peripheral temperature. The delay time controller 730 may also include additional delay units D that provide additional delay after the latch unit 725.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A PRAM (phase-change random access memory) comprising:

a write driver that generates a set current or a reset current in response to a set pulse or a reset pulse;

a temperature compensator that controls a pulse width of the set pulse or the reset pulse in response to a temperature of the PRAM; and a temperature detector that generates a control signal indicating the temperature of the PRAM, wherein the temperature compensator includes at least one forward or delay controller having a respective current controlled by said control signal with said respective current setting an end of the set pulse or the reset pulse for determining said pulse width.

2. The PRAM of claim 1, wherein a voltage level of the control signal increases with increase of the temperature.

3. The PRAM of claim 1, wherein the temperature compensator maintains the pulse width to be substantially constant irrespective of the temperature.

4. The PRAM of claim 3, wherein the temperature compensator includes:

a receiver for generating a first signal in response to a data pulse signal and a write activation signal;

a pulse controller that generates a second signal that is a delayed form of the first signal with a delay that depends on said respective current of said forward or delay controller; and a pulse generator that generates the set pulse or the reset pulse from the first and second signals.

5. The PRAM of claim 4, wherein the pulse controller includes said at least one forward or delay controller with:

at least one forward controller that each advances the end of the set pulse or the reset pulse for a higher level of the temperature; and at least one delay controller that each delays the end of the set pulse or the reset pulse for a higher level of the temperature.

6. The PRAM of claim 1, wherein the temperature compensator decreases the pulse width for a higher level of the temperature.

7. The PRAM of claim 6, wherein the temperature compensator includes:

a receiver for generating a first signal in response to a data pulse signal and a write activation signal;

a pulse controller that generates a second signal that is a delayed form of the first signal with a delay that depends on said respective current of said forward or delay controller; and a pulse generator that generates the set pulse or the reset pulse from the first and second signals.

8. The PRAM of claim 7 wherein the pulse controller includes said at least one forward or delay controller with:

at least one forward controller that each advances the end of the set pulse or the reset pulse for a higher level of the temperature.

9. A PRAM (phase-change random access memory) comprising:

a write driver that generates a set current or a reset current in response to a set pulse or a reset pulse;

means for controlling a pulse width of the set pulse or the reset pulse in response to a temperature of the PRAM; and means for generating a control signal indicating the temperature of the PRAM;

wherein the means for controlling the pulse width includes at least one forward or delay controller having a respective current controlled by said control signal with said respective current setting an end of the set pulse or the reset pulse for determining said pulse width.

10. The PRAM of claim 9, wherein the means for controlling includes:

means for maintaining the pulse width to be substantially constant irrespective of the temperature.

11. The PRAM of claim 10, wherein the means for maintaining includes:

means for advancing the end of the set pulse or the reset pulse for a higher level of the temperature; and means for delaying the end of the set pulse or the reset pulse for a higher level of the temperature, wherein said end of the set pulse or the reset pulse depends on said respective current through said at least one forward or delay controller.

12. The PRAM of claim 9, wherein the means for controlling includes:

means for decreasing the pulse width for a higher level of the temperature.

13. The PRAM of claim 12, wherein the means for decreasing includes:

means for advancing the end of the set pulse or the reset pulse for a higher level of the temperature, wherein said end of the set pulse or the reset pulse depends on said respective current through said at least one forward or delay controller.

14. A method for programming a PRAM (phase-change random access memory), comprising:

generating a set current or a reset current in response to a set pulse or a reset pulse; and controlling a pulse width of the set pulse or the reset pulse in response to a temperature of the PRAM; and generating a control signal indicating the temperature of the PRAM, wherein the step of controlling the pulse width includes controlling a respective current through at least one forward or delay controller using said control signal with said respective current setting an end of the set pulse or the reset pulse for determining said pulse width.

15. The method of claim 14, further comprising:

increasing a voltage level of the control signal with increase of the temperature.

16. The method of claim 14, further comprising:

maintaining the pulse width to be substantially constant irrespective of the temperature.

17. The method of claim 16, further comprising:

advancing the end of the set pulse or the reset pulse for a higher level of the temperature; and delaying the end of the set pulse or the reset pulse for a higher level of the temperature, wherein said end of the set pulse or the reset pulse depends on said respective current through said at least one forward or delay controller.

18. The method of claim 14, further comprising:

decreasing the pulse width for a higher level of the temperature.

19. The method of claim 18, further comprising:

advancing the end of the set pulse or the reset pulse for a higher level of the temperature, wherein said end of the set pulse or the reset pulse depends on said respective current through said at least one forward or delay controller.

* * * * *